United States Patent [19]

Li Bassi et al.

[11] Patent Number: 4,755,541
[45] Date of Patent: Jul. 5, 1988

[54] SUBSTITUTED BENZOPHENONES AND THEIR LIQUID MIXTURES SUITABLE FOR USE AS PHOTOPOLYMERISATION INITIATORS

[75] Inventors: Giuseppe Li Bassi, Gavirate; Luciano Cadoná, Carlo Nicora, both of Varese, all of Italy

[73] Assignee: Fratelli Lamberti SpA, Albizzate, Italy

[21] Appl. No.: 886,929

[22] Filed: Jul. 18, 1986

[30] Foreign Application Priority Data

Jul. 23, 1985 [IT] Italy ................................ 21684 A/85

[51] Int. Cl.⁴ .......................... C08F 2/50; C08F 4/40; C08L 63/10
[52] U.S. Cl. .................................... 522/10; 502/167; 522/8; 522/46; 522/103
[58] Field of Search ................ 522/8, 46, 10; 502/167

[56] References Cited

U.S. PATENT DOCUMENTS

| | | | |
|---|---|---|---|
| 4,017,652 | 4/1977 | Gruber | 522/8 |
| 4,056,665 | 11/1977 | Taylor | 522/8 |
| 4,324,628 | 4/1982 | Avar | 522/46 |
| 4,482,204 | 11/1984 | Blyler | 522/46 |
| 4,498,963 | 2/1985 | Neckers | 522/46 |
| 4,515,666 | 5/1985 | Rekers | 522/46 |
| 4,563,438 | 1/1986 | Berner | 522/10 |
| 4,609,612 | 9/1986 | Berner | 522/10 |
| 4,672,079 | 6/1987 | Li Bassi | 522/36 |

Primary Examiner—John C. Bleutge
Assistant Examiner—Arthur H. Koeckert
Attorney, Agent, or Firm—Stevens, Davis, Miller & Mosher

[57] ABSTRACT

As initiators for the photopolymerisation of ethylenically unsaturated compounds, the use of systems consisting of compounds of benzophenone type of formula I

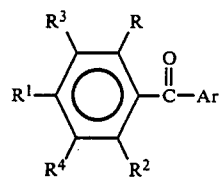

in which R, R' and R² are preferably alkyls of 1-4 carbon atoms, R³ and R⁴ are preferably hydrogen and Ar is preferably phenyl, in combination with donors of hydrogen or substances which determine the formation of labile photochemical complexes, such as alcohols, ethers and tertiary amines with hydrogen in the alpha position, and the use for the same purpose of mixtures of 2,4,6-trialkylbenzophenones and benzophenone and particularly of a mixture of 2,4,6-trimethylbenzophenone and benzophenone in a molar ratio of 1.155, which has the advantage of being liquid at temperatures exceeding 10° C. and of possessing photochemical activity superior to that of benzophenone.

7 Claims, No Drawings

SUBSTITUTED BENZOPHENONES AND THEIR LIQUID MIXTURES SUITABLE FOR USE AS PHOTOPOLYMERIZATION INITIATORS

This invention relates to the use of systems comprising substituted benzophenones and their liquid mixtures as photopolymerisation initiators for ethylenically unsaturated compounds.

Ethylenically unsaturated compounds and in particular acrylic and methacrylic acid derivatives can be polymerised by irradiation with ultraviolet light of wavelength between 200 and 450 nm in the presence of photoinitiator systems formed from:

(A) benzophenone or its derivatives (B) a donor of hydrogen or substances which determine the formation of a labile photochemical complex with the carbonyl compound (A), such as alcohols, tertiary amines or ethers having available hydrogens on the carbon adjacent to the heteroatom.

Examples of benzophenones which form these photoinitiator systems are benzophenone itself which is the most widely used, 4,4'-bis-dimethyl (or diethyl) aminobenzophenone (Michler ketone), which is very efficient in pigmented systems, 4-hydroxybenzophenone condensed with ethylne oxide and esterified with acrylic acid, which has the advantage of being liquid and copolymerisable, 2-carbomethoxybenzophenone, 3,3',4,4'-benzophenonetetracarboxylic acid esters etc. As many of these products are solid, they are difficult to incorporate into the photopolymerisable systems, or have a photochemical efficiency which is less than benzophenone itself. In accordance with the present invention, we have now surprisingly discovered that systems consisting of:

(A) compounds of formula I

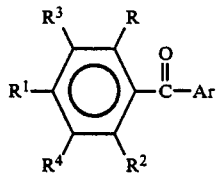

in which

R signifies linear or branched $C_1$-$C_{12}$ alkyl possibly substituted with one or more phenyl, chlorine, bromine, $C_1$-$C_{12}$ alkoxy, ArO—, ArSO—, ArSO$_2$—, $C_1$-$C_{12}$ alkylsulphinyl or $C_1$-$C_{12}$ alkylsulphonyl groups; or —SO$_3$H or $C_1$-$C_{12}$ dialkylamino, respectively as free acids or bases or salified with organic or inorganic bases; $C_1$-$C_{12}$ alkoxy; or ArO—

$R^1$, $R^2$ which can be equal or different, each independently have the same meaning as R or represent hydrogen or a bridge of carbon atoms with Ar or $R^3$ or $R^4$ possibly comprising heteroatoms $R^3$, $R^4$ which can be equal or different, each independently represent hydrogen, linear or branched $C_1$-$C_{12}$ alkyl, phenyl, chlorine, bromine, —SO$_3$H possibly salified with organic or inorganic bases, or ArCO—

AR represents a $C_6$-$C_{10}$ aryl either non-substituted or carrying one or more substitutes of the halogen, $C_1$-$C_{12}$ alkyl, phenyl, $C_1$-$C_4$ alkoxy, $C_3$-$C_6$ cycloalkoxy, phenoxy, —COOH, $C_1$-$C_5$ alkoxycarbonyl, benzoyl, $C_1$-$C_5$ dialkylamino, $C_1$-$C_5$ alkylthio, alkylsulphinyl, alkylsulphonyl, arylthio, arylsulphinyl and arylsulphonyl group; or 2,3 or 4-pyridyl; or a furan or thiopene residue (B) an organic tertiary amine of aliphatic type, or an ester of p-dimethylaminobenzoic acid or 4,4'-bis-($C_1$-$C_5$ dialkylamino) benzophenone, or single or polymeric ethers of primary or secondary alcohols or glycols or primary or secondary aliphatic alcohols or in any event donors of hydrogen or substances which determine the formation of labile chemical complexes, can be used in the photoinitiated polymerisation of ethylenically unsaturated compounds, and in particular of acrylic and methacrylic acid derivatives, with a photochemical efficiency considerably greater than that of analogous systems containing the currently used benzophenones indicated heretofore.

Further according to the invention, we have also surprisingly found that particular mixtures of benzophenone and compounds of formula I, by virtue of having melting points considerably lower than those of the individual compounds, can be used in the liquid state with considerable practical advantages with regard to their incorporation into the photopolymerisable mixtures, in combination with the compounds of type B indicated heretofore.

Preferred systems for use according to the present invention are those consisting of:

(A) one or more benzophenones of formula I in which

R, $R^1$, $R^2$ which can be equal or different, each independently signify $C_1$-$C_4$ alkyl, $R^3$, $R^4$ which can be equal or different, each independently signify hydrogen, $C_1$-$C_4$ alkyl, or —SO$_3$H possibly salified with organic or inorganic bases, Ar signifies phenyl, possibly substituted with one or more $C_1$-$C_4$ alkyl, Cl, Br or $C_1$-$C_4$ alkylthio groups (B) an organic tertiary amine of aliphatic type, or an ester of p-dimethylaminobenzoic acid or 4,4'-bis-($C_1$-$C_5$ dialkylamino) benzophenone, or molecules containing single or polymeric derivatives of glycols.

Examples of compounds of formula 1 are:
2,4,6-trimethylbenzophenone
2,4,6-triethylbenzophenone
2,4,6-triisopropylbenzophenone
2,4,6-tritert.butylbenzophenone
2,4,6-trimethoxybenzophenone
2,3,4,5,6-pentamethylbenzophenone
sodium 2,4,6-trimethylbenzophenone-3-sulphonate
4-(2,4,6-trimethylbenzoyl)pyridine
2-(2,4,6-trimethylbenzoyl)pyridine.

Preferred as liquid mixtures of compounds of formula I and benzophenone are those with molar ratios of between 0.1 and 10.

Particularly preferred as liquid mixtures of compounds of formula I and benzophenone are those of 2,4,6-trimethylbenzophenone and benzophenone in molar ratios of between 1 and 1.3 having a pour point less than 0° C.

Particularly preferred compounds of type B are single polymeric derivatives of aliphatic alkanolamines, esters of p-dialkylaminobenzoic acid, and aliphatic alcohols and glycols possibly carrying acrylic saturations or included in macromolecular structures.

Compounds of formula I are known from the scientific literature and are normally obtained by Friedel-Crafts acylation (Houben Weyl, Methoden der Organischen Chemie, Band VII/2a, Teil 1, pag. 164–233) in accordance with the two following alternatives:

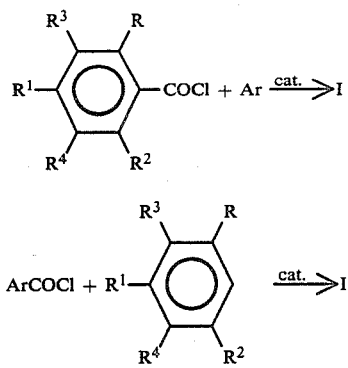

where cat. signifies a Friedel-Crafts catalyst. For example 2,4,6-trimethylbenzophenone has been obtained by acylation of mesitylene with benzoyl chloride in the presence of anhydrous aluminium chloride [Louise, Annales del Chemie, 6 (6) 202; H. O. House et al., J. Org. Chem., 41, 3083 (1976)].

Although there are numerous publications in the literature on the photochemistry and photophysics of the compounds of formula I, and in particular of 2,4,6-trialkylbenzophenones [Y. Kitaura et al., Tetrahedron, 27 1597 (1971) - Y. Ito et al., J. Am. Chem. Soc. 102, 5917 (1980), ibid. 105, 1590 (1983), J. Org. Chem., 46, 4359 (1981) - G. Porter et al., J. Chem. Soc. (A) 3772 (1971), Chem. Comm., 1372 (1970)] there is no reference to their use as polymerisation photoinitiators.

The photopolymerisable compounds with which the photoinitiator systems according to the present invention can be advantageously used are di, tri, tetra or polyfunctional monomers and oligomers of acrylic or methacrylic type, such as esters or amides.

Photopolymerisable oligomers and prepolymers are represented most commonly by polyester, polyether, polyurethane, acrylic, epoxy and silicone resins containing acrylic or methacrylic functionalities. Those mixtures useful in the art are those formed from the aforesaid monomers and oligomers in possible combination with pigments, fillers, thermal stabilisers, light stabilisers, antioxidants, paraffins etc., various auxiliaries such as anti-foaming agents, dispersants etc. The co-use of other photoinitiators such as benzyl ketals, benzoin ethers, thioxanthones etc. is also possible.

Photopolymerisable mixtures containing the photoinitiator systems according to the present invention can be used as coatings for wood, metal, paper, fabrics, plastics materials, fibreglass, rubber; printing inks, adhesives and sealants; masses for fabricating printing plates or silk-screen matrices; masses for fabricating structural materials.

With regard to light sources, the photopolymerisation process can use medium, low or high pressure mercury vapour lamps, superactinic lamps or lamps specially designed to obtain high radiation intensity at wavelengths between 250 and 450 nm.

The photoinitiator systems according to the present invention are used in a quantity of between 0.1 and 15% by weight of the photopolymerisable mixture, and preferably between 0.5 and 10% by weight. The ratio of component A to component B can vary between 0.1 and 10 but values of between 0.5 and 1.5 are preferred.

When the compounds of formula I are used as the benzophenone system of type A, three advantages are obtained over the use of benzophenone itself, namely better photochemical efficiency and less film coloration and odour.

When liquid mixtures of compounds of formula I with benzophenone are used, in addition to the stated advantages the preparation of photopolymerisable mixtures takes less mixing time and lower temperatures can be used. In addition the fact that a liquid photoinitiator is used helps to keep the viscosity low and allows co-solubilisation of components which would otherwise be more difficult to dissolve.

The following examples illustrate the invention in greater detail, but without limiting it (the parts are by weight).

The benzophenones used are indicated by abbreviations and have the following characteristics:

BF = benzophenone - crystalline solid, M.P. 49° C., IR spectrum (KBr) : 1655, 1275, 695, 633 cm$^{-1}$.

TMB = 2,4,6-trimethylbenzophenone - metastable liquid, B.P. 189° C. (17 mmHg) or crystalline solid with M.P. 35.5° C., IR spectrum (KBr) : 1670, 1270, 917, 710 cm$^{-1}$.

TEB = 2,4,6-triethylbenzophenone - liquid, B.P. 210°–220° C. (40 mmHg), IR spectrum (liquid film) : 1660, 1270, 925, 865, 705 cm$^{-1}$.

TIPD = 2,4,6-triisopropylbenzophenone - crystalline solid, M.P. 98°–99° C., IR spectrum (KBr) : 1665, 1250, 950, 930, 880, 725 cm$^{-1}$.

PMB = 2,3,4,5,6-pentamethylbenzophenone - crystalline solid, M.P. 134°–135° C., IR spectrum (KBr) : 1670, 1210, 890, 705 cm$^{-1}$.

TMOB = 2,4,6-trimethoxybenzophenone - crystalline solid, M.P. 112°–113° C., IR spectrum (KBr) : 1660, 1600, 1585, 1125, 810 cm$^{-1}$.

MDEA = N-methyldiethanolamine - liquid.

EXAMPLE 1

Eutectic mixture of 2,4,6-trimethylbenzophenone and benzophenone (BF/TMB)

585 g of 2,4,6-trimethylbenzophenone (M.P. 35.5° C.) are heated to 45° C., 415 g of benzophenone (M.P. 49° C.) are added, and after agitation for 15 minutes the mixture is cooled to 20° C. A composition is obtained (molar ratio TMB/BF = 1.155) having the following characteristics; IR spectrum (liquid film): 1660, 1270, 905, 700 cm$^{-1}$; clear liquid up to 10° C.; pour point (ASTM D97/66) less than −10° C.; Brookfield viscosity RVT 1/20 rpm = 55 mPas at 20° C., e = 145 mPas at 10° C.

EXAMPLES 2 to 5

The photo-crosslinkable mixtures having the composition indicated in the individual examples given hereinafter were applied to a glass plate to a thickness of 50 microns. After exposure to air for 30 seconds the films were irradiated by successive passages at the indicated conveying speed under a medium pressure mercury vapour lamp of the indicated power at a distance of 10 cm from the light source. Sward hardness (ASTM D2134-66) and yellowing (ASTM D1925-63T) were determined.

The thermal stability, evaluated for photoinitiated mixtures kept in darkness at 60° C., was greater than 30 days for all the photoinitiator systems.

In Example 2, the operating conditions and results were as follows:

| Photo-crosslinkable composition | Laromer ® LR 8496 (acrylated aliphatic epoxy resin BASF) (R) | 95-93 |
| --- | --- | --- |
| | MDEA | 1-3 |
| | Benzophenone compound (50% solution in 1,6-hexanedioldiacrylate) (A) | 4 |
| Lamp power | 40 W/cm | |
| Conveying speed | 20 m/min. | |

| A | MDEA parts by wt | R parts by wt | Film tackiness after 1 passage | Sward hardness after | | | Yellowing Index after 4 passages |
| --- | --- | --- | --- | --- | --- | --- | --- |
| | | | | 2 passages | 3 passages | 4 passages | |
| BF (a) | 1 | 95 | liquid | 6 | 10 | 14 | 5 |
| | 2 | 94 | tacky | 8 | 12 | 14 | 6 |
| | 3 | 93 | slightly tacky | 10 | 10 | 14 | 6 |
| TMB | 1 | 95 | tacky | 8 | 12 | 16 | 3 |
| | 2 | 94 | slightly tacky | 10 | 12 | 16 | 3 |
| | 3 | 93 | dry | 10 | 12 | 16 | 3 |
| BF/TMB | 1 | 95 | slightly tacky | 8 | 12 | 14 | 4 |
| | 2 | 94 | dry | 8 | 12 | 16 | 4 |
| | 3 | 93 | dry | 10 | 12 | 16 | 4 |

(a) BF was used for comparison purposes

In Example 3, the operating conditions and results were as follows:

| Photo-crosslinkable composition | Laromer ® EA 81 (acrylated aromatic epoxy resin BASF) (R) | 86 |
| --- | --- | --- |
| | 1,6-hexanediol diacrylate (HDDA) | 0-12.25 |
| | benzophenone compound (50% solution in HDDA) (B) | 1-8 |
| | MDEA | 0.75-6 |
| Lamp power | 40 W/cm | |
| Conveying speed | 20 m/min. | |

| B | B parts by wt | MDEA parts by wt | HDDA parts by wt | Sward hardness after | | | | |
| --- | --- | --- | --- | --- | --- | --- | --- | --- |
| | | | | 1 passage | 2 passages | 3 passages | 4 passages | 5 passages |
| BF (a) | 1 | 0.75 | 12.25 | tacky | 2 | 6 | 6 | 8 |
| | 2 | 1.5 | 10.50 | 12 | 18 | 20 | 24 | 24 |
| | 4 | 3.0 | 7.0 | 12 | 20 | 24 | 26 | 30 |
| | 8 | 6.0 | — | 8 | 16 | 20 | 26 | 28 |
| TMB | 1 | 0.76 | 12.26 | 8 | 10 | 12 | 12 | 12 |
| | 2 | 1.5 | 12.50 | 16 | 22 | 22 | 28 | 28 |
| | 4 | 3.0 | 7.0 | 14 | 24 | 28 | 32 | 32 |
| | 8 | 6.0 | — | 12 | 22 | 26 | 26 | 30 |
| BF/TMB | 1 | 0.75 | 12.25 | 4 | 8 | 10 | 10 | 12 |
| | 2 | 1.5 | 10.50 | 12 | 18 | 22 | 26 | 26 |
| | 4 | 3.0 | 7.0 | 14 | 22 | 28 | 30 | 32 |
| | 8 | 6.0 | — | 12 | 20 | 12 | 26 | 28 |
| PMB | 2 | 1.5 | 10.50 | — | 22 | 22 | 26 | 26 |
| TIPB | 2 | 1.5 | 10.50 | — | 18 | 22 | 24 | 26 |
| TMOB | 2 | 1.5 | 10.50 | — | 16 | 20 | 22 | 24 |

(a) BF was used for comparison purposes

In Example 4, the operating conditions and results were as follows:

| Photo-crosslinkable composition | Laromer ® EA 81 | 86 |
| --- | --- | --- |
| | benzophenone compound (18.2% solution in vinylpyrrolidone) (B) | 11 |
| | MDEA | 3 |
| Lamp power | 40 W/cm | |
| Conveying speed | 20 m/min. | |

| | Sward Hardness after: | | | |
| --- | --- | --- | --- | --- |
| | 1 passage | 2 passages | 3 passages | 4 passages |
| BF (a) | 22 | 30 | 32 | 38 |
| TMB | 24 | 32 | 38 | 40 |
| TIPB | 18 | 32 | 38 | 40 |
| PMB | 20 | 30 | 36 | 38 |
| TEB | 26 | 28 | 34 | 38 |

(a) BF was used for comparison purposes

In Example 5, the operating conditions and results were as follows:

| Photo-crosslinkable composition | Laromer ® 55 F (acrylated polyester resin BASF) | 100 |
| --- | --- | --- |
| | benzophenone compound (A) | 2 |
| | Silicone Dow DC 190 (20% solution in xylene) | 0.2 |
| Film thickness | 500 microns | |
| Lamp power | 80 W/cm | |

| | Yellowing index of crosslinked film after: | |
| --- | --- | --- |
| A | 1 passage at 3.5 m/min | 10 passages at 1 m/min |
| BF (a) | 2 | 15 |
| TMB | 2 | 10 |
| 2,2-dimethoxy-2-phenylacetophenone (b) | 10 | 20 |
| 1-benzoylcyclohexanol (b) | 5 | 12 |

(A) used for comparison purposes
(b) non-benzophenone compounds used for comparion purposes.

We claim:

1. Systems useful as initiators for the photopolymerization of ethylenically unsaturated compounds, comprising:
   (a) a mixture of benzophenone and at least one benzophenone of formula I

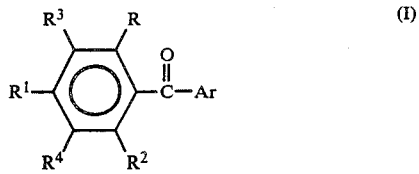

in which
   R, $R^1$, $R^2$, which can be the same or different, each independently represent a $C_1$–$C_4$ alkyl,
   $R^3$, $R^4$, which can be the same or different, each independently represent a member selected from the group consisting of hydrogen, $C_1$–$C_4$ alkyl, —$SO_3H$ and $SO_3H$ salified with organic or inorganic bases,
   Ar represents a member selected from the group consisting of phenyl, unsubstituted or substituted with one or more $C_1$–$C_4$ alkyl, Cl, Br, and $C_1$–$C_4$ alkylthio; and
   (b) at least one member selected from the group consisting of an organic tertiary amine of aliphatic type, an ester of p-dimethylaminobenzoic acid, 4,4'-bis-($C_1$–$C_6$ dialkylamino) benzophenone.

2. Systems according to claim 1, wherein the benzophenone of formula (I) is 2,4,6-trimethylbenzophenone.

3. System according to claim 1, wherein the benzophenone of formula (I) is 2,4,6-triethylbenzophenone.

4. System according to claim 1, wherein the benzophenone of formula (I) is 2,4,6-triisopropyl-benzophenone.

5. System according to claim 1, wherein the benzophenone of formula (I) is 2,3,4,5,6-pentamethylbenzophenone.

6. Systems according to claim 1, wherein the benzophenone of formula (I) is mixed with benzophenone in a molecular ratio of from 10:1 to 1:10.

7. A photocurable composition comprising at least one photopolymerizable ethylenically unsaturated compound and the composition of claim 1 as photoinitiator therefor.

* * * * *